US006482678B1

(12) United States Patent
Frost et al.

(10) Patent No.: US 6,482,678 B1
(45) Date of Patent: Nov. 19, 2002

(54) WAFER PREPARATION SYSTEMS AND METHODS FOR PREPARING WAFERS

(75) Inventors: David T. Frost, San Jose; Oliver David Jones, Watsonville, both of CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 09/540,421

(22) Filed: Mar. 31, 2000

(51) Int. Cl.$^7$ ............................................... H01L 21/44
(52) U.S. Cl. ............................ 438/115; 438/906; 134/2
(58) Field of Search ................................. 438/115, 906, 438/974; 134/2, 3

(56) References Cited

U.S. PATENT DOCUMENTS

| | | | |
|---|---|---|---|
| 4,722,752 A | | 2/1988 | Steck |
| 5,520,744 A | * | 5/1996 | Fujikawa et al. |
| 5,974,680 A | | 11/1999 | Anderson et al. |
| 6,032,683 A | | 3/2000 | Casey et al. |
| 6,095,167 A | * | 8/2000 | Florez |

FOREIGN PATENT DOCUMENTS

| | | | |
|---|---|---|---|
| JP | 6163491 A | * | 6/1994 |
| JP | 06163491 | | 6/1994 |
| JP | 6-163491 | * | 6/1994 |
| JP | 10189528 | | 7/1998 |

* cited by examiner

Primary Examiner—Caridad Everhart
(74) Attorney, Agent, or Firm—Martine & Penilla, LLP

(57) ABSTRACT

Wafer preparation systems and methods for wafer preparation are provided. The wafer preparation system includes a scrubber unit and a dryer unit arranged vertically with the dryer unit above the scrubber unit. The scrubber unit is configured to receive a wafer for mechanical scrub cleaning, and the dryer unit is configured to receive the wafer from the scrubber unit for drying after the mechanical scrub cleaning. The cleaning and the drying are accomplished with the wafer in a vertical orientation. An edge holder attached to a lifter rod lifts the wafer through the scrubber unit to the dryer unit. The method for wafer preparation includes receiving a wafer in a scrubbing station and lifting the wafer internally from the scrubbing station to the drying station that is located above the scrubbing station in a vertical arrangement.

21 Claims, 10 Drawing Sheets

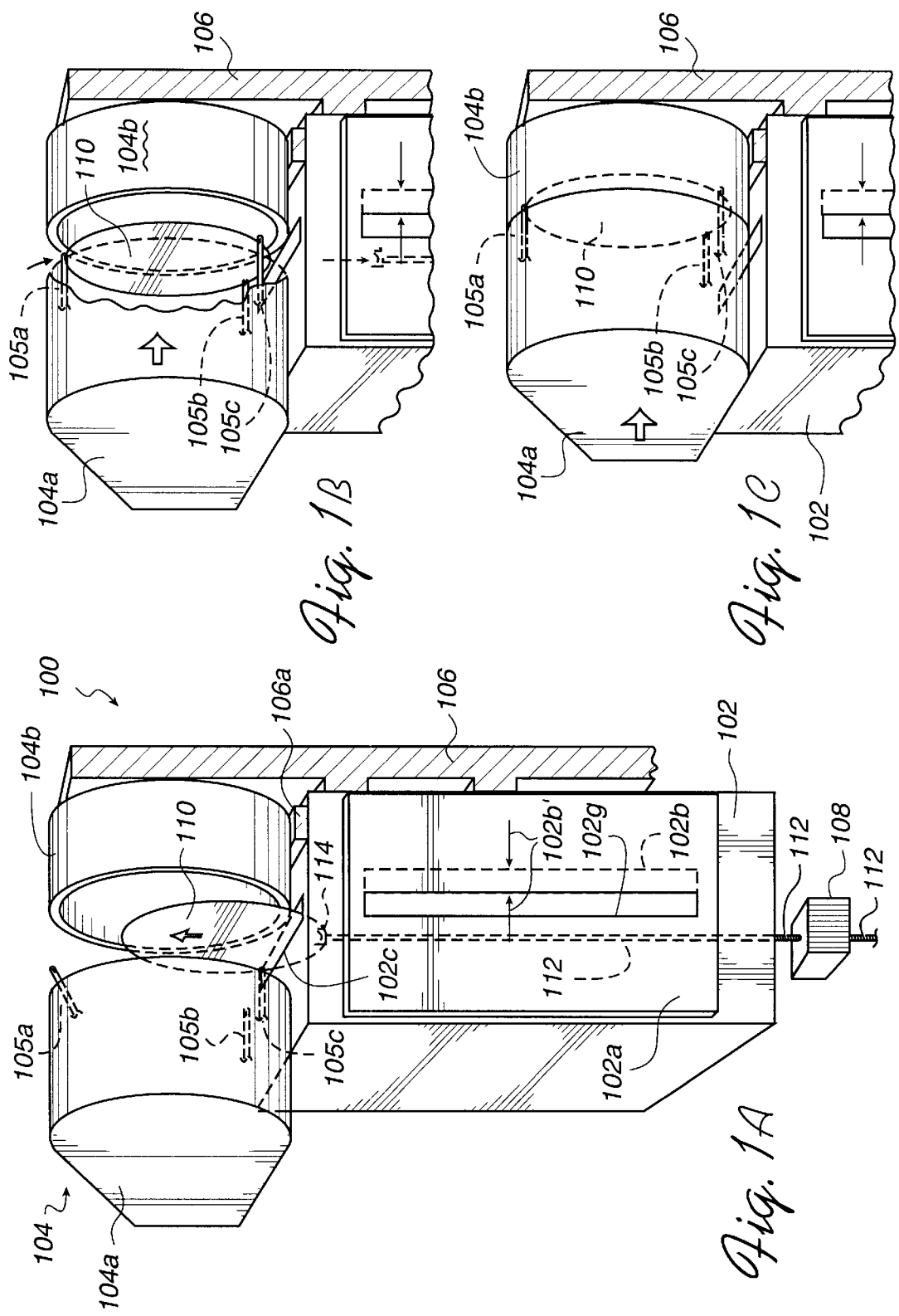

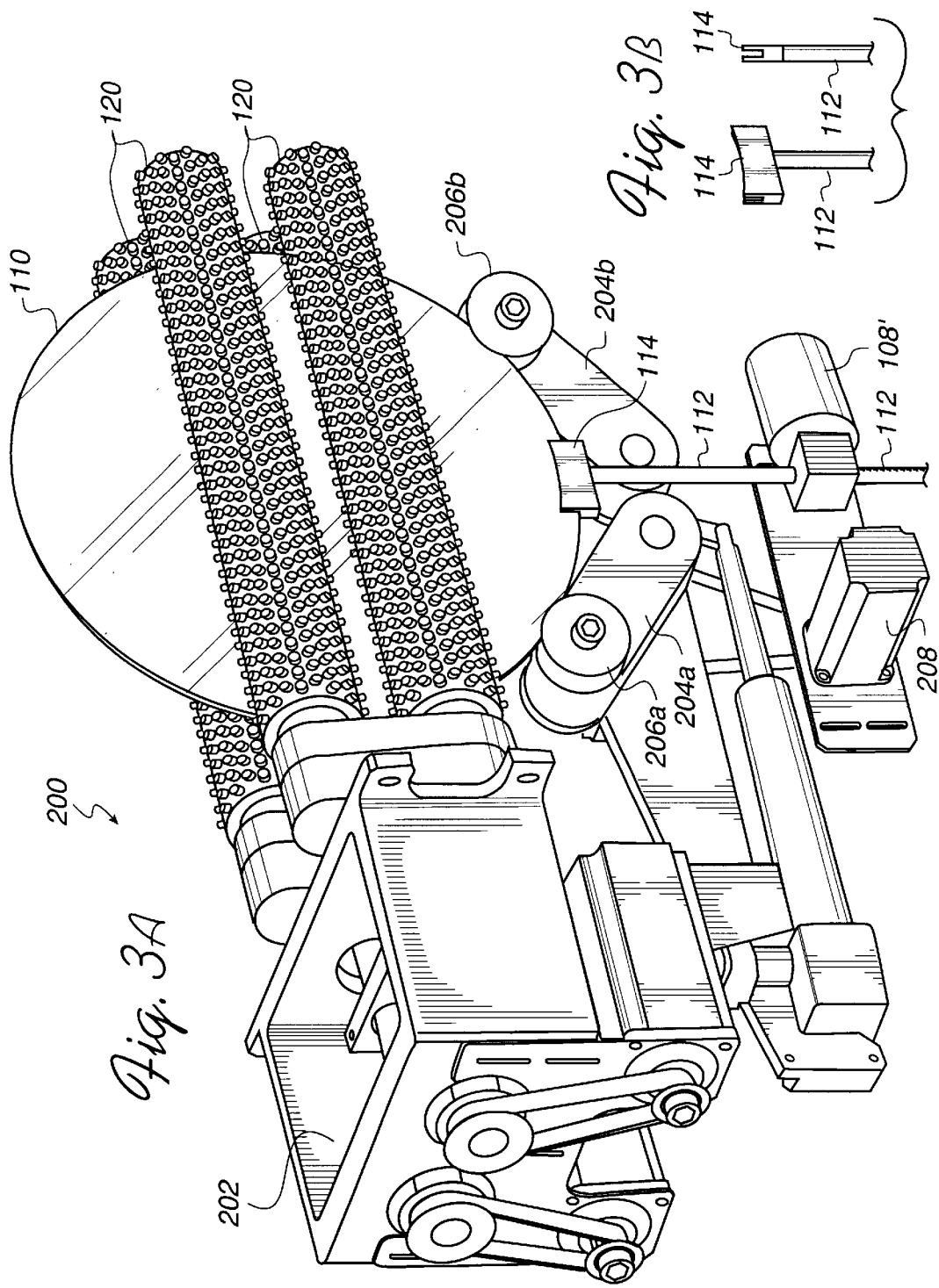

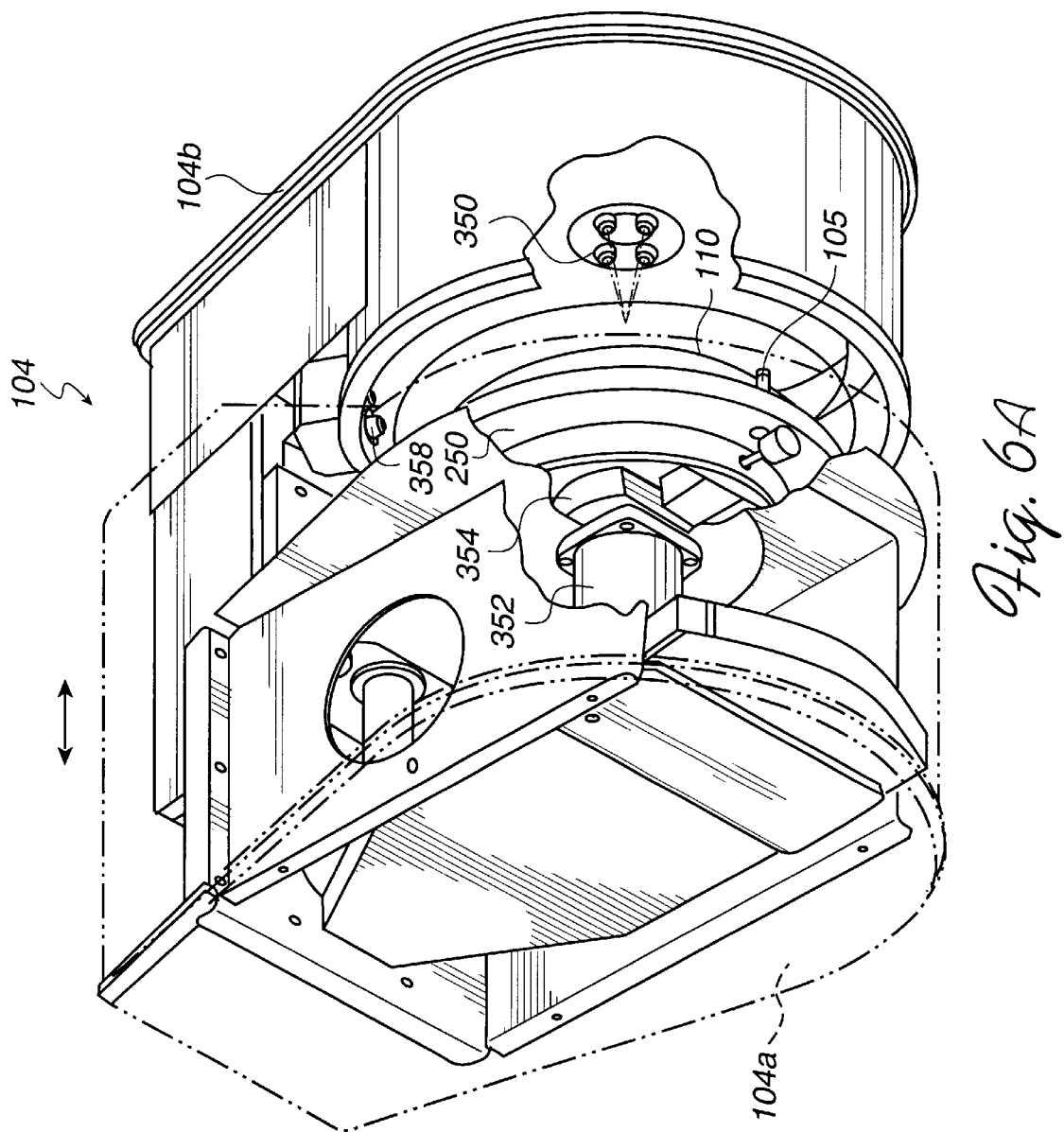

WAFER PREPARATION SYSTEMS AND METHODS FOR PREPARING WAFERS

CROSS REFERENCE TO RELATED APPLICATIONS

This application is related to U.S. patent application Ser. No. 09/540,161, filed on the same day as the instant application and entitled "METHOD FOR PERFORMING TWO WAFER PREPARATION OPERATIONS ON VERTICALLY ORIENTED SEMICONDUCTOR WAFER IN SINGLE ENCLOSURE." This cross referenced application is hereby incorporated by reference.

BACKGROUND OF THE INVENTION

1. Field of the Invention

The present invention relates generally to semiconductor wafer preparation systems and method for preparing wafers, more particularly, the present invention relates to the cleaning and drying of semiconductor wafers using space and process efficient systems.

2. Description of the Related Art

In the fabrication of semiconductor devices, there is a need to perform chemical mechanical polishing (CMP) operations and wafer cleaning. Typically, integrated circuit devices are in the form of multi-level structures. At the substrate level, transistor devices having diffusion regions are formed. In subsequent levels, interconnect metallization lines are patterned and electrically connected to the transistor devices to define the desired functional device. As is well known, patterned conductive layers are insulated from other conductive layers by dielectric materials, such as silicon dioxide. As more metallization levels and associated dielectric layers are formed, the need to planarize the dielectric material grows. Without planarization, fabrication of further metallization layers becomes substantially more difficult due to the higher variations in the surface topography. In other applications, metallization line patterns (e.g., copper metal) are formed in the dielectric material, and then, metal CMP operations are performed to remove excess metallization. After any such CMP operation, it is necessary that the planarized wafer be cleaned to remove particulates and contaminants.

In the prior art, wafer cleaning systems typically implement brush stations in which polyvinyl alcohol (PVA) brushes are used to scrub both sides of a wafer. The PVA brush material is configured to be soft enough to prevent damage to the wafer's delicate surface, yet can provide good mechanical contact with the wafer surface to dislodge residues, chemicals and particulates. Each of the brushes are typically configured to deliver chemicals and or DI water through the brush (TTB). Commonly, two brush stations are used, each with a pair of brushes, to enable the application of chemicals in one brush station and DI water in the other. This dual brush station approach has been shown to improve the cleaning performance as well as increase throughput. One physical layout of the cleaning system is to arrange the brush stations longitudinally (i.e., horizontally). The wafer therefore travels from one brush station to the next along a conveying system. Once the wafer has been processed in both brush stations, the wafer is then conveyed to a next station in which the wafer is subjected to a spin, rinse, and dry (SRD) operation, which is performed in an SRD station or dryer station. Because these stations are arranged horizontally, the machine necessarily occupies a large clean room footprint, in some systems being as long as 6–7 feet by 3 feet wide.

In other wafer cleaning systems, such as the one described in U.S. Pat. No. 5,875,507, which is herein incorporated by reference, the illustrated wafer cleaning systems and a dryer system are also arranged horizontally. An end effector robot is configured to handle the wafers and transport them between each cleaning station and the dryer system. This arrangement, although efficient in cleaning wafers in vertical orientations, takes up substantial clean room area. Additionally, this arrangement requires that the robot handle the wafer at each stage of the process. That is, the robot is required to bring wafers into and out of each cleaning station and also into and out of the dryer. This level of interaction, although configured to be as clean as possible, can introduce particulates and can slow down the process.

In view of the foregoing, there is a need for wafer preparation systems that are more compact, occupy smaller clean room footprints, and shelter a wafer from excessive transport operations between preparation operations (e.g., such as cleaning, etching, drying and the like).

SUMMARY OF THE INVENTION

Broadly speaking, the present invention fills these needs by providing a wafer preparation system incorporating a scrubber and a dryer that are vertically oriented and configured to accomplish essential wafer processing while minimizing system footprint, minimizing wafer transport operations, and thereby minimizing auxiliary systems such as robots for end effectors. It should be appreciated that the present invention can be implemented in numerous ways, including as a process, an apparatus, a system, a device or a method. Several inventive embodiments of the present invention are described below.

In one embodiment, a wafer preparation system is disclosed. The wafer preparation system includes a scrubber unit that is configured to receive a wafer for mechanical scrub cleaning. A dryer unit is located above the scrubber unit in a vertical orientation. The dryer unit is configured to receive the wafer from the scrubber unit after the mechanical scrub cleaning, and then dry the wafer.

In another embodiment, a method of wafer preparation is disclosed. The wafer preparation method includes receiving a wafer in a scrubbing station. The method further provides the lifting of the wafer from the scrubbing station to a drying station that is arranged vertically over the scrubbing station.

In yet another embodiment, a wafer scrubbing and drying apparatus is disclosed. The wafer scrubbing and drying apparatus includes a scrubber unit that has scrub brushes oriented to scrub a wafer in a vertical orientation. A dryer unit is positioned over a top region of the scrubber unit, and the dryer unit is configured to receive the wafer from the scrubber unit. The wafer is received in a vertical orientation by the dryer from a slot in the top region of the scrubber unit.

In still a further embodiment, a semiconductor wafer preparation apparatus is disclosed. The semiconductor wafer preparation apparatus includes a wafer cleaning station and a drying station that is mounted over the wafer cleaning station.

The advantages of the present invention are many and substantial. Most notably, the vertical orientation of the wafer preparation system significantly reduces system footprint and required clean room floor space. The vertical orientation represents a significant advancement over prior art that extends preparation systems over a large floor space area and requires repeated robot wafer handling to transport wafers from one preparation station or unit to the next. The present invention not only minimizes required floor space, but minimizes the need for repeated robot handling, reducing both the cost of operation and the potential for contamination.

Another advantage of the present invention is the embodiment that provides increased flexibility in wafer preparation processes by accommodating both chemical cleans or etching processes and DI water rinses in both scrubber and dryer units. The vertical orientation of the wafer preparation system incorporates a dual brush set in the scrubber unit which can dispense both chemicals and DI water in whatever combination the wafer process dictates. The dryer unit is also configured to dispense both chemicals and DI water, and in the vertical orientation, the wafer preparation system can incorporate an environment that gets progressively cleaner as the wafer proceeds higher in the system. Thus, the first scrub operation can be the most vigorous and successive etch, clean and rinse operations can be in cleaner conditions, the successive operations being located higher in the vertically oriented system.

Finally, a preferred embodiment of the present invention affords a more efficient process with increased throughput over prior art. A single robot can load wafers into the scrubber unit of the wafer preparation system and unload wafers from the dryer unit. In a vertical orientation, multiple wafer preparation systems can be implemented to share resources in smaller floor space areas to maximize the savings and efficiency achieved.

Other aspects and advantages of the present invention will become apparent from the following detailed description, taken in conjunction with the accompanying drawings, illustrating by way of example the principles of the present invention.

BRIEF DESCRIPTION OF THE DRAWINGS

The present invention will be readily understood by the following detailed description in conjunction with the accompanying drawings. To facilitate this description, like reference numerals designate like structural elements.

FIG. 1A shows a vertically oriented wafer scrubber-dryer unit in accordance with one embodiment of the present invention.

FIG. 1B illustrates the load/unload position of the dryer unit in accordance with one embodiment of the invention.

FIG. 1C shows the dryer unit in the closed position in accordance with one embodiment of the present invention.

FIG. 3A illustrates the scrubber brush assembly in accordance with one embodiment of the invention.

FIG. 3B shows a detailed view of the edge holder in accordance with an embodiment of the invention.

FIG. 6A shows a detailed view of the dryer in accordance with an embodiment of the present invention.

DETAILED DESCRIPTION OF THE PREFERRED EMBODIMENTS

Figure 2A:
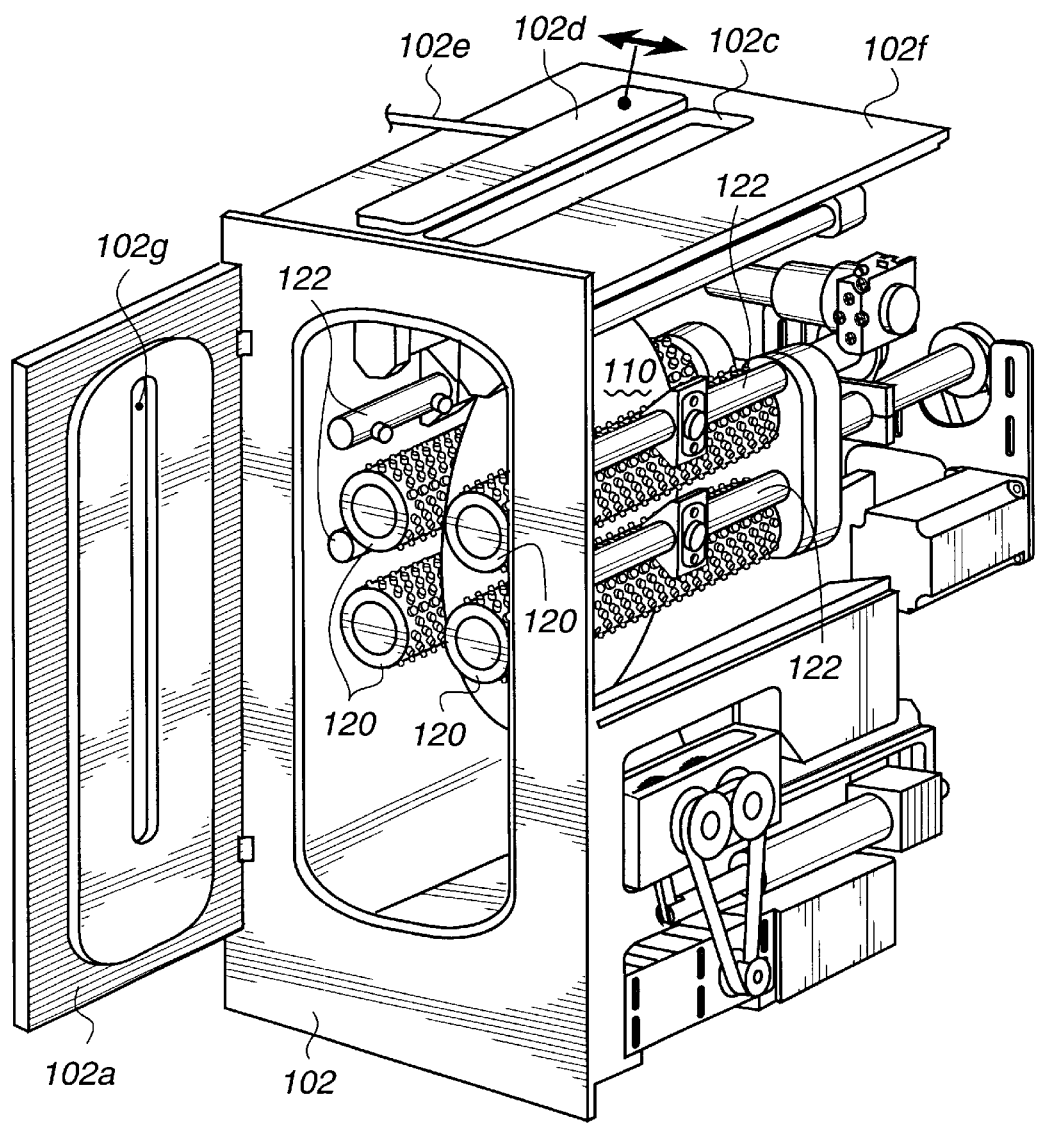
FIG. 2A shows a front and side perspective view of the scrubber unit in accordance with one embodiment of the invention.

An invention for wafer processing equipment, namely, wafer scrubbing, cleaning, etching, rinsing, and drying is disclosed. In preferred embodiments, a wafer preparation system includes a wafer scrubbing unit that is configured to receive a wafer and then transfer the wafer internally to a dryer unit. The dryer unit, in this preferred embodiment, is positioned over the wafer scrubbing unit. In the following description, numerous specific details are set forth in order to provide a thorough understanding of the present invention. It will be understood, however, to one skilled in the art, that the present invention may be practiced without some or all of these specific details. In other instances, well known process operations have not been described in detail in order not to unnecessarily obscure the present invention.

FIG. 1A shows a vertically oriented wafer scrubber-dryer unit in accordance with one embodiment of the present invention. As shown, a dryer unit 104 is mounted above a scrubber unit 102 and integrated as a wafer preparation system 100. The mounting of the dryer unit 104 over the scrubber unit 102 can be done in any number of ways. By way of example, the dryer unit 104 can be bolted to a portion of the scrubber unit 102, it can be mounted to a housing support, it can be attached to a wall, or it can be suspended over the scrubber unit 102 using appropriate supports. In either case, the dryer unit 104 is positioned over the scrubber unit 102 so as to save valuable clean room space and to achieve other advantages as will be discussed below.

In one embodiment, the dryer unit includes a moveable dryer housing 104a configured to move towards and away from a fixed dryer housing 104b to define positions of open, closed, and load/unload which are described in greater detail below. FIG. 1A shows the dryer unit 104 of the wafer preparation system 100 in the open position. The fixed dryer housing 104b is secured to a system support structure 106 that spans and supports both the dryer unit 104 and the scrubber unit 102 of the system 100. A support mount 106a, in one embodiment, is positioned between the scrubber unit 102 and the fixed dryer housing 104b.

A wafer 110 is shown entering the dryer unit 104 through a second slot opening 102c in the scrubber unit 102. Fingers 105b, 105c are configured to support the wafer 110 in the dryer unit 104, and a pivot finger 105a is configured to pivot to the edge of the wafer 110 to secure the wafer 110 in its mounting. In one embodiment, the wafer 110 is lifted through the scrubber unit 102 by an edge holder 114 on a lifter rod 112 driven by a lifter rod controller 108.

The wafer 110 enters the scrubber unit 102 through a first slot opening 102g located in a front panel door 102a. The first slot opening 102g is configured to be opened and closed by way of a slider door 102b that slides in the required direction 102b' to open or seal the first slot opening 102g. In general, a wafer 110 to be processed is introduced into the wafer preparation system 100 through the first slot opening 102g, and the slider door 102b closes to seal the system. The wafer 110 is scrubbed in the scrubber unit 102, and then lifted to the dryer unit 104 by an edge holder 114 mounted on a lifter rod 112. The wafer 110 exits the scrubber unit 102 through the second slot opening 102c and transitions into the dryer unit 104 when it is in the open position as shown in FIG. 1A. The wafer 110 is mounted and secured in the dryer unit 104 by way of the fingers 105b, 105c, and the pivot finger 105a. The wafer 110 is dried in the dryer unit 104, and a clean and dry wafer 110 is removed from the wafer preparation system 100. As used herein, the term drying should be understood to mean a number of possible operations, such as, spinning a wafer, rinsing a wafer, applying chemicals to a wafer and then rinsing the wafer (e.g., in order to perform etching with chemicals such as HF), and also simply drying. Therefore, the terms "dry," "drying," "dryer," "dryer unit," and "drying system" are used and should be interpreted to include any one or a combination of the operations defined herein and those having similar applications.

FIG. 1B illustrates the load/unload position of the dryer unit 104 in accordance with one embodiment of the invention. As can be seen, the moveable dryer housing 104a moves in the direction of the fixed dryer housing 104b. The wafer 110, completely within the dryer unit 104, is supported by fingers 105b, and 105c. Pivot finger 105a pivots from a raised and unlocked position and downward to attach to the edge of the wafer 110, thus securing the wafer in a mounting by the fingers 105b, 105c and the pivot finger 105a.

In one embodiment, the load/unload position is a two stage position. In a first stage of the load position, the wafer 110 is lifted into the dryer unit 104 by the edge holder 114 to a position in which the bottom edge of the wafer 110 is slightly above the fingers 105b and 105c. The moveable housing 104a is then positioned such that the fingers 105b and 105c are located under the bottom edge of the wafer 110 at a position to hold the wafer 110 by the edge when lowered. In the second stage of the load position, the wafer 110 is then lowered onto the fingers 105b and 105c and the pivot finger 105a pivots downward to secure the top edge of the wafer 110 and complete the operation of mounting the wafer 110 in the dryer unit 104. The edge holder 114 is then withdrawn from the dryer unit 104 so that the moveable dryer housing 104a can continue to the closed position.

FIG. 1C shows the dryer unit 104 in the closed position in accordance with one embodiment of the present invention. The moveable dryer housing 104a is positioned so that it meets and overlaps with the fixed dryer housing 104b and seals the dryer unit 104. The wafer 110 is shown inside the sealed dryer unit 104 mounted on the fingers 105b and 105c and secured by pivot finger 105a.

FIG. 2A shows a front and side perspective view of the scrubber unit 102 in accordance with one embodiment of the invention. The front panel door 102a is shown in the open position which allows access to the various components of the scrubber assembly. The first slot opening 102g is located in the front panel door 102a. During scrubbing operations, the front panel door 102a is in the closed position and the wafer 110 is inserted into the scrubber unit 102 through the first slot opening 102g.

The second slot opening 102c is shown in the top plate 102f on the top of the scrubber unit 102. A top door 102d is shown in an open position with directional arrows indicating a direction of movement of the top door 102d to the open or closed positions. The top door 102d is illustrated connected to a positioning bar 102e that controls the movement of the top door 102d in accordance with one embodiment of the invention. In another embodiment, the position of the top door 102d is controlled by pins, brackets, or other such devices mounted on the bottom of the moveable dryer housing (104a, FIGS. 1A–1C) that would position the top door 102d in accordance with the position of the moveable dryer housing 104a. In yet another embodiment, the top door 102d is located within the scrubber unit 102 and positioned by known mechanical operations within the scrubber unit 102.

Four brushes 120 are shown within the scrubber unit 102 configured symmetrically such that there are two brushes 120 on opposite sides of the wafer 110 above two brushes 120 on opposite sides of the wafer 110. The two brushes 120 closest to the top plate 102f define an upper set of brushes 120, and the two brushes 120 below the upper set of brushes 120 define a lower set of brushes 120. Above each brush 120 is shown a manifold containing multiple nozzle heads configured to be sprayers 122 above each brush 120.

During a scrub operation, the brushes 120 are configured to scrub opposite sides of the wafer 110 in pairs such that as the lower set of brushes 120 are positioned in contact with and performing a scrub operation on the wafer 110, the upper set of brushes 120 are retracted away from the wafer 110. The scrubber 102 is configured to then position the upper set of brushes 120 so that the upper set of brushes 120 are in contact with and performing a scrub operation on the wafer 110 and the lower set of brushes 120 are retracted away from the wafer 110. A set of sprayers 122 is associated with each brush 120 and remain in a fixed location relative to each brush 120. The fixed location is above each brush 120, and the sprayers 122 provide the fluid for the scrubbing operation, fluid for cleaning, or fluid for etching as required.

In accordance with one embodiment of the present invention, the vertical orientation of the scrubbing operation promotes a dirty-to-clean progression in the scrubbing process. In a dirty-to-clean progression, the higher the scrubbing operation of the wafer progresses in the scrubber 102, the cleaner the operation. By way of example, the lower set of brushes begins the operation by performing a scrubbing process and using, for example, some chemical/DI water solution (e.g., hydrofluoric acid (HF) or other such chemicals) to perform an initial scrubbing operation. As described above, the upper set of brushes 120 is retracted away from the wafer 110 while the lower set is in contact with the wafer 110 and performing a scrubbing operation. The sprayers 122, located above the brushes 120, can introduce DI water or chemicals into the process. Alternatively, the chemicals or DI water can be introduced through the brush.

After a first scrub operation using the lower set of brushes 120 is complete, the upper set of brushes 120 move toward the wafer as the lower set of brushes 120 move away. Using the upper set of brushes 120, a second scrub operation can be performed. By way of example, the second scrub operation can include the use of another chemical (e.g., that may be weaker) or DI water to remove most of the chemicals and particulates. In addition, the sprayers 122 can also assist in removing any chemicals and/or particulates.

Figure 2B:
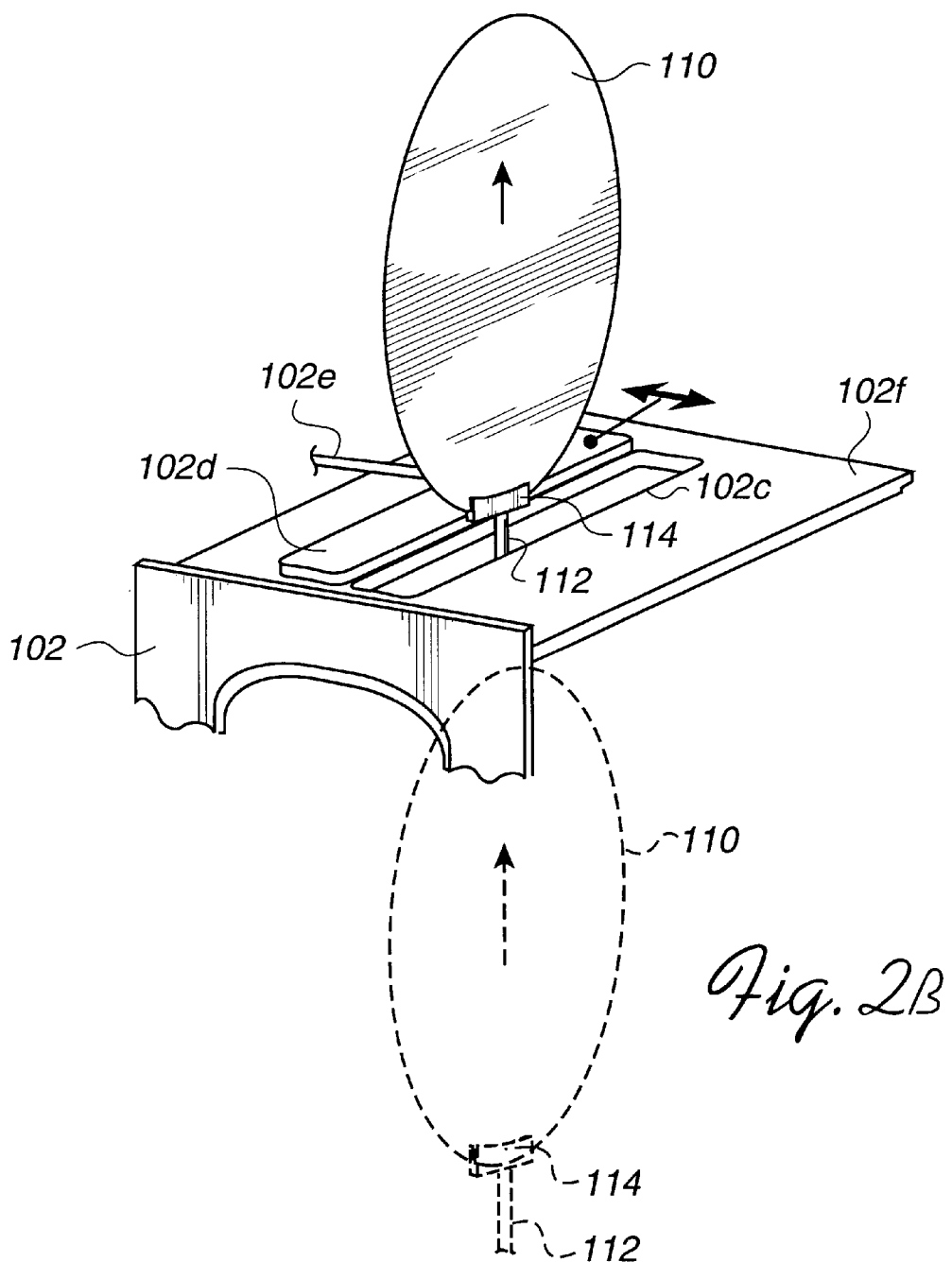
FIG. 2B illustrates the transition of the wafer out of the scrubber unit in accordance with an embodiment of the present invention.

FIG. 2B illustrates the transition of the wafer 110 out of the scrubber unit 102 in accordance with an embodiment of the present invention. The wafer 110 is lifted through the scrubber unit 102 by the edge lifter 114 attached to the lifter rod 112. The top door 102d must be in the open position enabling the wafer 110 to exit the scrubber unit 102 through the top slot 102c in the top plate 102f. Upon exiting the scrubber unit 102, the wafer transitions to the dryer unit 104 as discussed in greater detail below.

FIG. 3A illustrates the scrubber brush assembly 200 in accordance with one embodiment of the invention. The scrubber brush assembly 200 includes 4 brushes 120 configured in an upper set of brushes 120 and a lower set of brushes 120 as defined above. During the scrubbing operation, the brushes 120 are configured to rotate to produce the desired scrubbing action. As described above, only the upper set of brushes 120 or the lower set of brushes 120 is in contact with and performing a scrubbing operation on a wafer 110 at any one time. When the lower set of brushes is performing a scrubbing operation, the upper set of brushes is retracted away from the wafer 110. When the upper set of brushes 120 is performing a scrubbing operation, the lower set of brushes 120 is retracted away from the wafer 110. The positioning and rotation of the brushes is controlled by the brush control assembly 202.

The wafer 110 is supported in place during the scrub operation by wafer drive rollers 206a, 206b. The wafer drive rollers 206a, 206b are mounted to roller arms 204a, 204b. In addition to the scrub operation being accomplished by the rotation of the brushes 120 against the wafer 110, the wafer drive rollers 206a, 206b drive a rotation of the wafer 110. During the scrubbing operation, the edge holder 114 is retracted away from the wafer 110. The wafer drive rollers 206a, 206b, support the wafer 110 and, driven by a motor 208, rotate the wafer 110. The wafer 110 can also be moved up or down to accomplish off-center scrubbing by raising or lowering the roller arms 204a, 204b.

When the scrubbing operation is completed, the edge holder 114 is raised into position by the lifter rod 112 which is driven by lifter rod controller 108'. The lifter rod controller 108' in the illustrated embodiment is a servo motor, but in other embodiments it can be pneumatic, hydraulic, a linear actuator, or any suitable mechanical device to controllably raise and lower the wafer 110 through the scrubber unit 102 and to the dryer unit 104 overhead (see FIG. 1).

FIG. 3B shows a detailed view of the edge holder 114 in accordance with an embodiment of the invention. The edge holder 114 is attached to an end of the lifter rod 112, and is configured to support the wafer 110 by a small portion of the edge of the wafer 110. The interior of the edge holder 114 as seen in the cross sectional view is configured in a "V" shape. This design is configured to minimize the contact area with the surface of the wafer 110 (e.g., the active region) while providing ample support to lift the wafer 110 through the scrubber unit 102 and position it in the dryer unit 104 as described above.

Figure 3C:
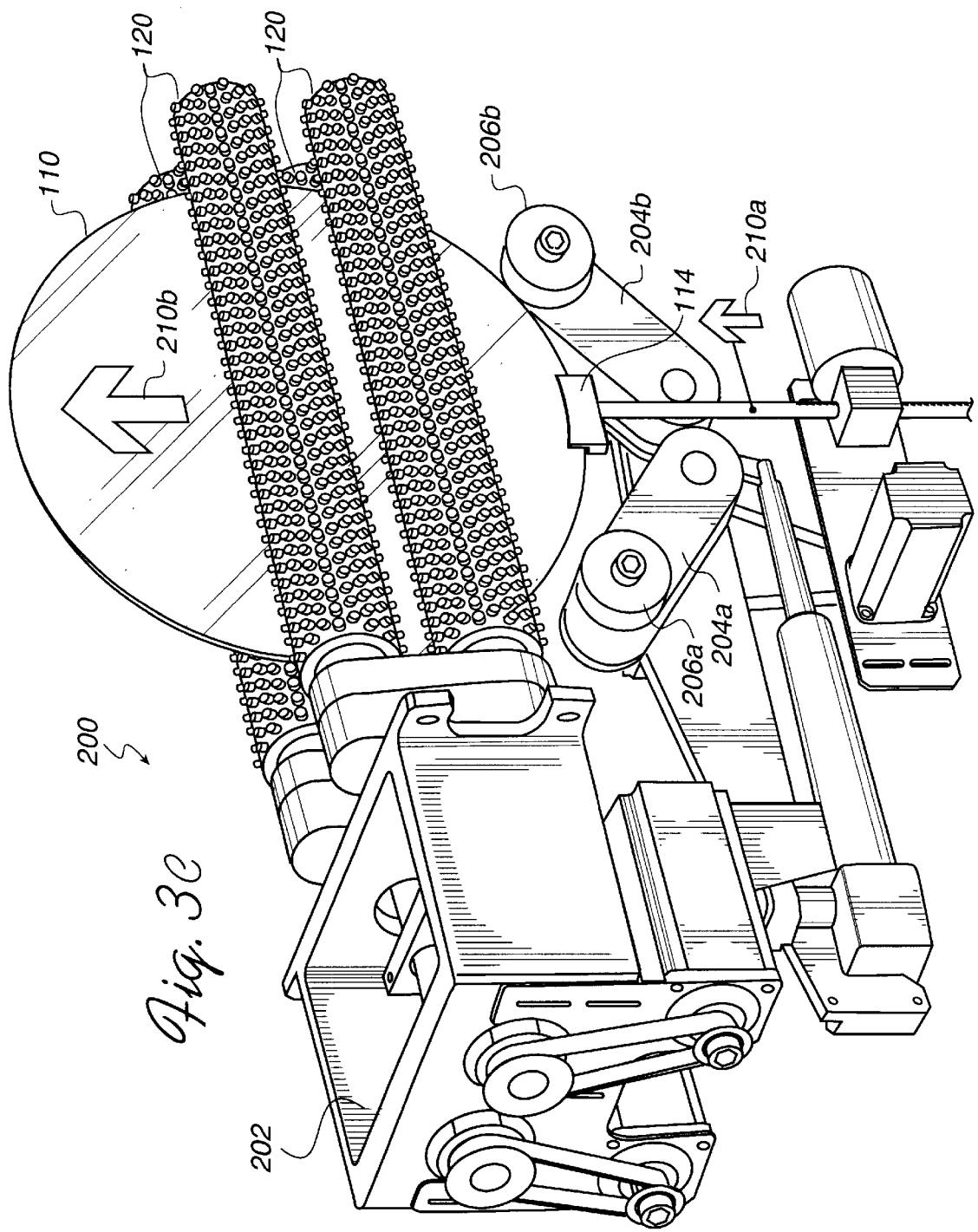
FIG. 3C shows the wafer being lifted in accordance with one embodiment of the present invention.

FIG. 3C shows the wafer 110 being lifted in accordance with one embodiment of the present invention. At the end of the scrub operation, the edge holder 114 is lifted by the lifter rod 112 which is driven by the lifter rod controller 108' or 108. When the edge holder is positioned to support the wafer 110, the brushes 120 are retracted by the brush control assembly 202. The lifter rod 112 proceeds to lift the edge holder 114 in direction 210a resulting in the wafer 110 rising through the scrubber brush assembly 200 in direction 210b. As the wafer 110 rises, support of the wafer 110 is transferred from the wafer drive rollers 206a, 206b to the edge holder 114, and in this manner, the wafer is lifted through the scrubber unit 102 to the dryer unit 104 above.

Figures 4A, 4B:
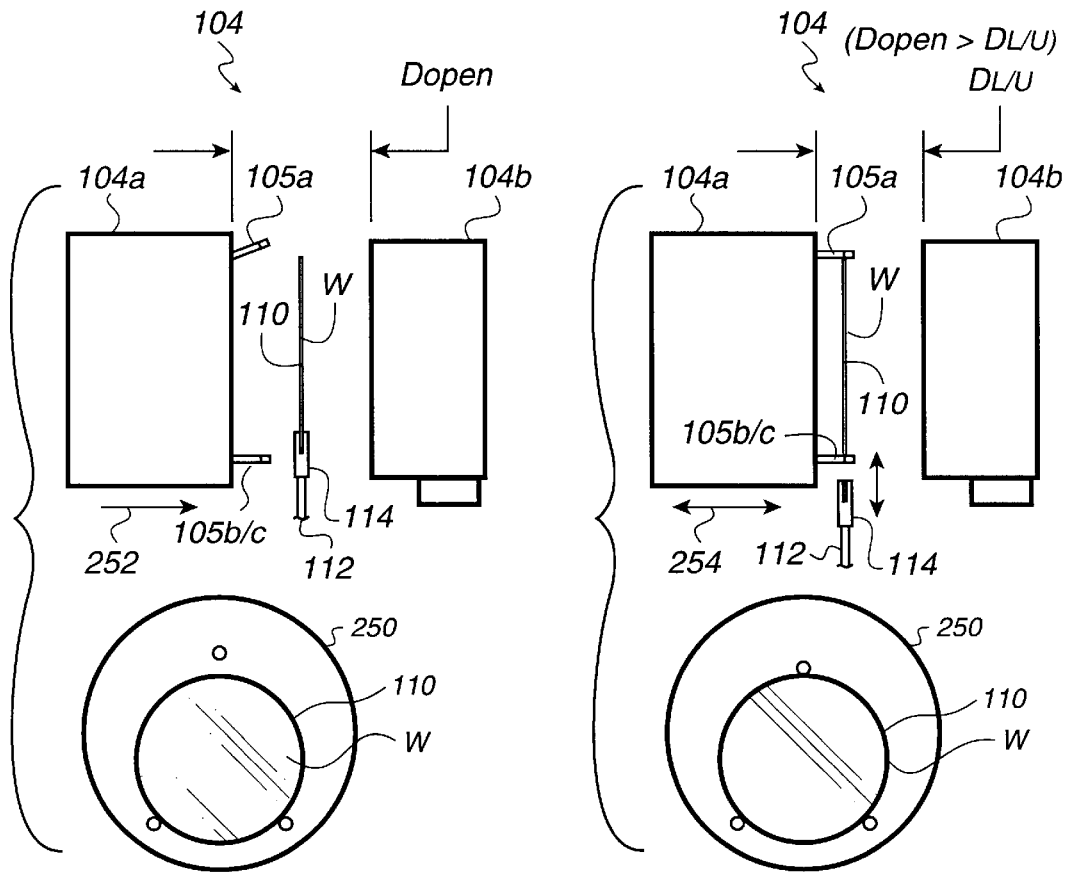
FIGS. 4A–4C show a side view of the dryer unit in each of the three positions with a detail of the wafer position in the open, the load/unload, and the closed positions in accordance with an embodiment of the invention.
Figure 4C:
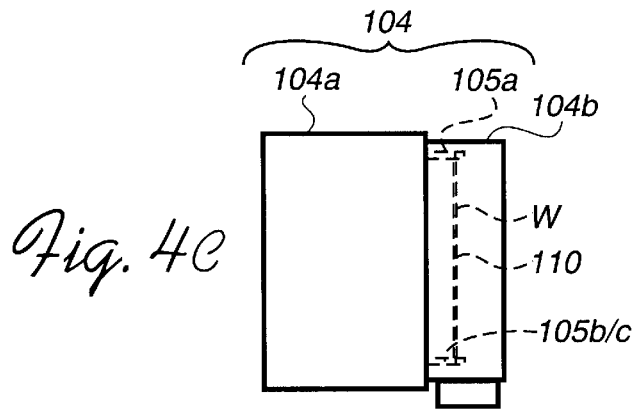

As described above in reference to FIGS. 1A–1C, one embodiment of the dryer unit 104 has 3 positions: open, load/unload, and closed. FIGS. 4A–4C show a side view of the dryer unit 104 in each of the three positions with a detail of the wafer position in the open, the load/unload, and the closed positions in accordance with an embodiment of the invention. In FIG. 4A, the dryer unit 104 is in the open position. The moveable dryer housing 104a is at the greatest separation distance ($D_{open}$) possible from the fixed dryer housing 104b. The only direction the moveable dryer housing 104a can move from this position (e.g., during operation) is toward the fixed dryer housing 104b and this movement is represented by directional arrow 252. The wafer 110 is shown in the side view supported by edge holder 114 on the end of lifter rod 112. Pivot finger 105a is shown in the raised or unlocked position. Fingers 105b, 105c are represented by a single structure from the side.

The wafer detail of FIG. 4A shows that the wafer 110 is actually above the fingers 105b, 105c which are represented as dots on a platen 250. From this position, the moveable dryer housing 104a can proceed to the load/unload position.

FIG. 4B shows the load/unload position. The moveable dryer housing 104a has moved to a position closer to the fixed dryer housing 104b, the distance between the housings now represented by $D_{L/U}$. From the load/unload position, the moveable dryer housing 104a can be moved either away from or towards the fixed dryer housing 104b as represented by bi-directional arrow 254. In the load/unload position, the wafer 110 is positioned on the fingers 105b, 105c, and the pivot finger 105a pivots from a raised, unlock position, downward to attach to the edge of the wafer 110, securing the wafer in a mounting by the fingers 105b, 105c and the pivot finger 105a. As can be seen in the wafer detail, the wafer is mounted and secured by the pivot finger 105a and fingers 105b, 105c to the platen 250. The lifter rod 112 then retracts the edge holder 114 away from the wafer 110 and out of the dryer unit 104.

FIG. 4C shows the dryer unit 104 in the closed position. The moveable dryer housing 104a is mated to the fixed dryer housing 104b which seals the dryer unit 104. As will be described in greater detail below, the wafer 110 is securely mounted on the platen 250 by the pivot finger 105a and fingers 105b, 105c and within the fixed dryer housing 104b portion of the sealed dryer unit 104.

Figure 5:
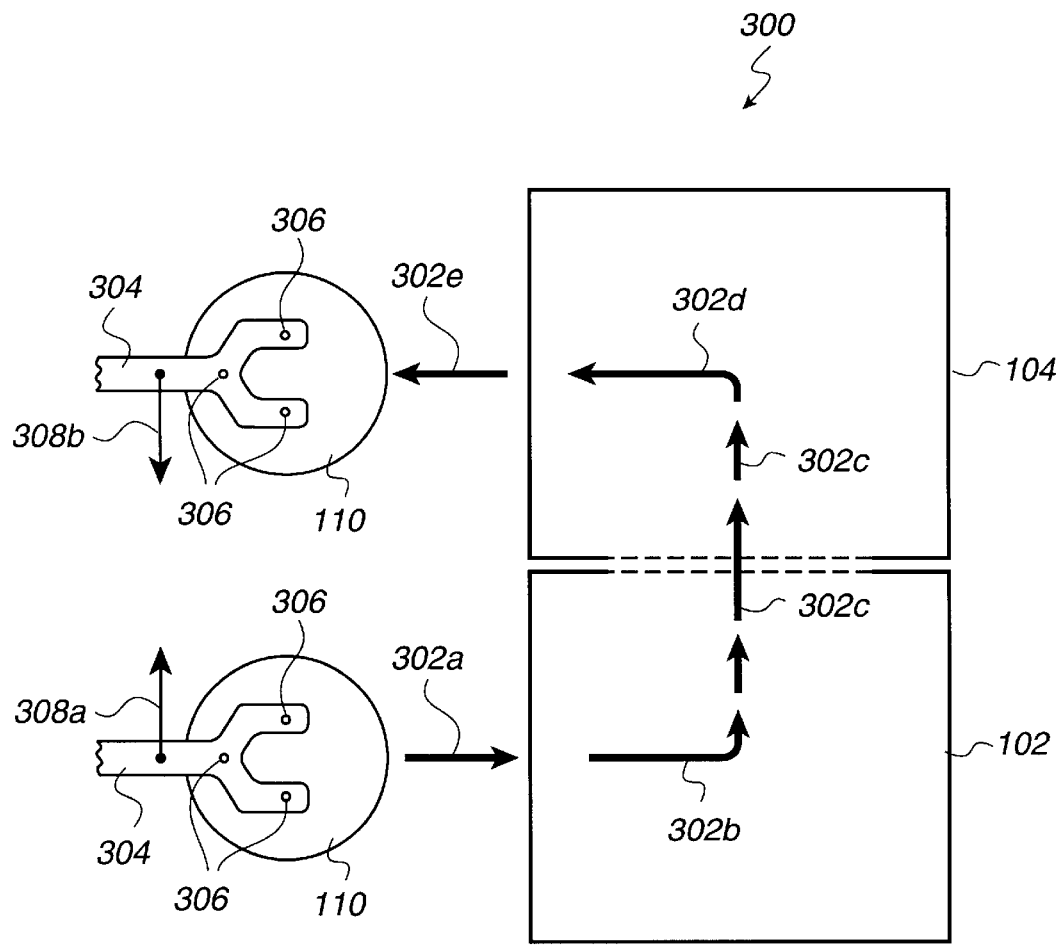
FIG. 5 is a graphical representation of a wafer preparation process in accordance with one embodiment of the present invention.

FIG. 5 is a graphical representation of a wafer preparation process 300 in accordance with one embodiment of the present invention. The wafer 110 is manipulated (e.g., moved to or from desired positions) by an end effector 304, and the wafer is secured to the end effector 304 by way of vacuum holds 306 or other such apparatus or processes to secure a wafer to an end effector 304 or other robotic arm designed to efficiently transport wafers while maintaining clean room standards and integrity. The wafer 110 is inserted 302a into the scrubber unit 102, and positioned 302b in the scrubber assembly. In one embodiment, multiple scrubbing processes are accomplished with each process resulting in the wafer becoming cleaner and cleaner. After the scrub process is completed, the wafer is transitioned 302c (from within the scrubber unit 102) into the dryer unit 104 overhead, and positioned 302d for the drying process. In one embodiment, the processes completed in the dryer unit 104 include spinning the wafer 110, rinsing the wafer 110, etching the wafer 110, drying the wafer 110, and the like. At the completion of the drying process, the wafer 110 is extracted 302e by the end effector 304, being secured to the end effector by vacuum holds 306 or other such securing apparatus or methods as described above. In one embodiment, the end effector 304 is attached to the same robot as is the end effector 304 that inserted 302a the wafer 110 at the beginning of the illustrated wafer preparation process 300. Alternatively, two or more end effectors can be used.

FIG. 6A shows a detailed view of the dryer 104 in accordance with an embodiment of the present invention. As described above, the dryer 104 includes a moveable dryer housing 104a and a fixed dryer housing 104b. In one embodiment, the moveable dryer housing 104a is mechanically positioned to one of an open, a load/unload, or a closed position. The wafer 110 is transitioned into the dryer 104 as described above, and is mounted on the platen 250 and secured with fingers 105. The platen 250 is attached to a spin motor 352 using a mounting block 354, and is configured to spin with the wafer 110 secured thereon. As shown in FIG. 6A, a set of nozzles 350 is provided to direct rinsing fluid at the back side of the wafer 110.

In one embodiment, the wafer 110 is transitioned to the dryer 104 when the dryer 104 is in the open position. The wafer 110 is lifted through the scrubber 102 (see FIG. 1A) after completion of the scrub operation, and enters the dryer 104 configured above the scrubber 102 while the dryer 104 is in the open position. The moveable dryer housing 104a is moved to the load/unload position, and the wafer 110 is mounted on the platen 250 using fingers 105 as described above in reference to FIGS. 1A–1C. The active side (e.g., the side having devices fabricated thereon) of the wafer 110 is positioned facing the moveable dryer housing 104a, and once the wafer 110 is mounted, the moveable dryer housing 104a is moved again to mate with the fixed dryer housing 104b and seal the dryer 104 in a closed position.

In the closed position, the dryer 104 is configured to perform any of a spin, rinse, etch, or drying operation of the wafer 110. For more information on the structure and functionality of the dryer 104, reference can be made to U.S. Pat. No. 6,012,470, issued Jan. 11, 2000, which is hereby incorporated by reference.

Figure 6B:
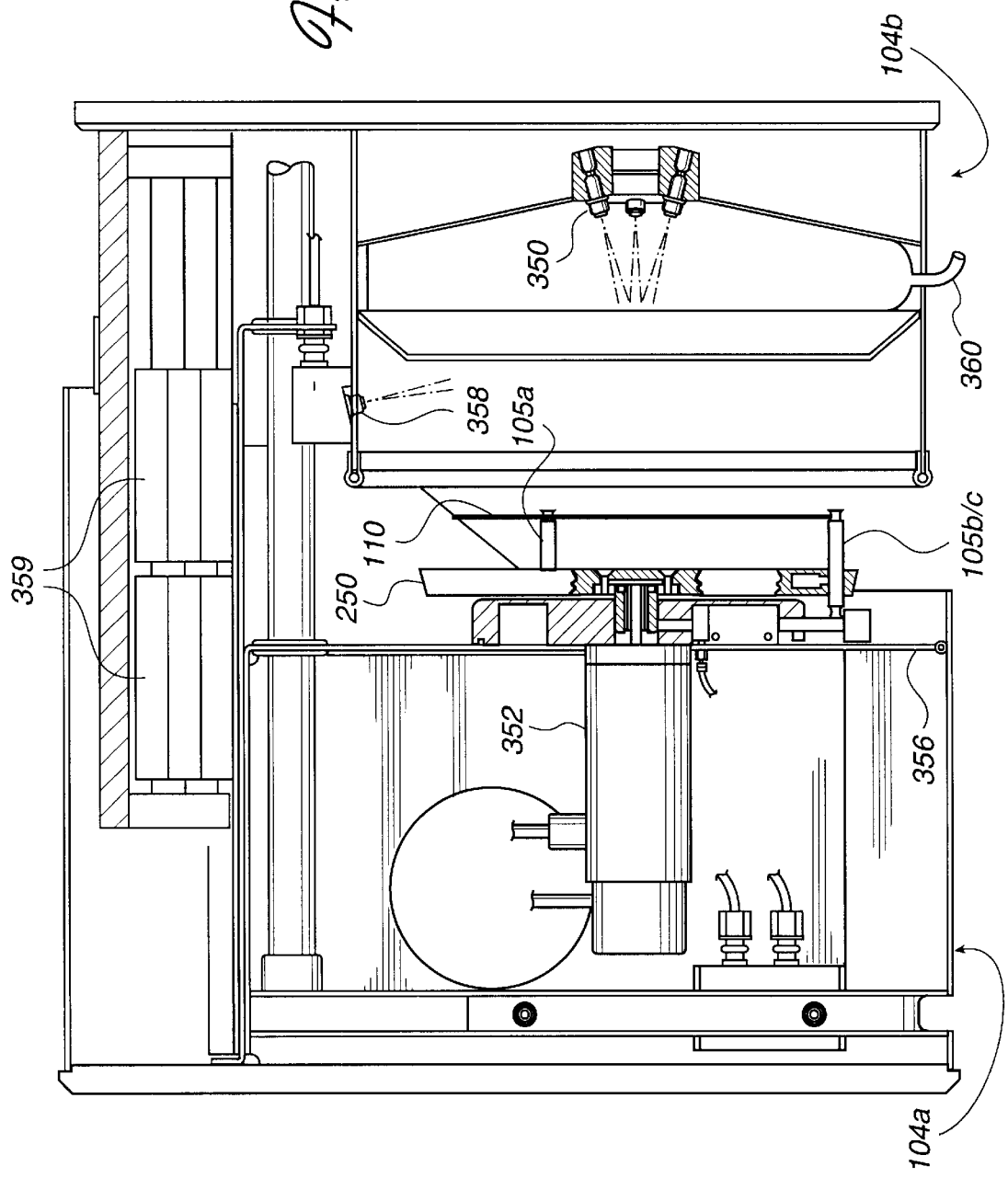
FIGS. 6B and 6C show a perspective overhead view of a dryer in accordance with one embodiment of the invention.
Figure 6C:
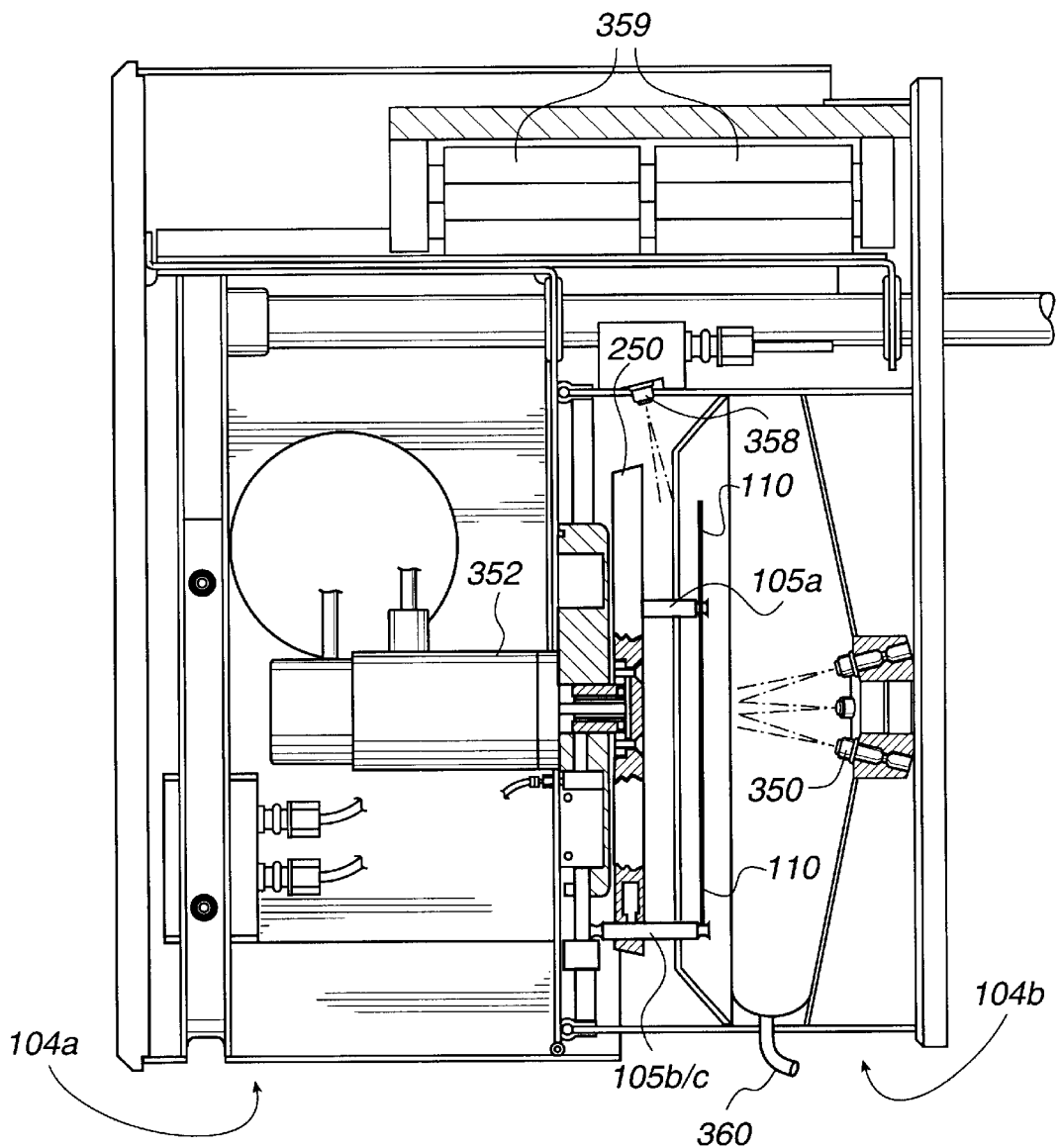

FIGS. 6B and 6C show a perspective overhead view of a dryer 104 in accordance with one embodiment of the invention. FIG. 6B shows the dryer 104 in the load/unload position, and FIG. 6C shows the dryer 104 in the closed position. In one embodiment, a servo motor 359 is located on the side of the dryer 104 and controls the positioning of the moveable dryer housing 104a. In the load/unload position (FIG. 6B), the wafer 110 is mounted to the platen 250 using fingers 105b, 105c. As described above, a pivot finger 105a is used to secure the wafer 110 in the mounting. Once the wafer 110 is positioned and the edge holder 114 (see FIGS. 3A–3B) is withdrawn from the dryer 104, the servo motor 359 drives the moveable housing 104a to the fixed housing 104b and the closed position. The back side of the wafer 110 is the side that faces the fixed housing 104b, and is rinsed by a set of nozzles 350 directing a rinsing fluid or process chemical. The active side of the wafer 110 faces the platen 250 and is rinsed (or etched followed by a rinse) by nozzles 358 directing a fluid at that side of the wafer 110. FIGS. 6B–6C show a representative nozzle 358 directing the fluid at the active side of the wafer 110 in accordance with one embodiment, and nozzles 358 can be positioned in any suitable location or in any suitable configuration in accordance with the needs of the desired process and the size of the wafer 110.

A drain 360 is shown in FIGS. 6B–6C for removal of fluid from the dryer unit 104. A drain 360 is necessary in the drying environment to remove fluids, but in a preferred embodiment, it would not be visible from an overhead perspective as a drain 360 would be most effective when positioned in the lowest portion of the dryer 104.

Once a wafer 110 is processed through the preparation system 100, the wafer can be processed through other well known fabrication operations. These operations include, as is well known, deposition or sputtering of oxide materials and conductive materials (e.g., aluminum, copper, mixtures, and the like). The process, also known as "the backside" process also includes etching operations. These etching operations are designed to define the network of metallization lines, vias, and other geometric patterns necessary to define the interconnect structure of an integrated circuit device. In between these operations, some chemical mechanical polishing (CMP) operations are also needed to planarize the surface to enable more efficient fabrication. After any of such operations, the wafer will need to be cleaned and dried before proceeding to a next operation in the process of making an integrated circuit device. Once complete, the wafer is cut into dies, each die representing one integrated circuit chip. The chips are then placed into suitable packages and integrated into a desired end device, such as a consumer electronic end product.

While this invention has been described in terms of several preferred embodiments, it will be appreciated that those skilled in the art upon reading the preceding specifications and studying the drawings will realize various alterations, additions, permutations and equivalents thereof. It is therefore intended that the present invention includes all such alterations, additions, permutations, and equivalents as fall within the true spirit and scope of the invention.

What is claimed is:

1. A wafer preparation system, comprising:
   a scrubber unit configured to receive a wafer for mechanical scrub cleaning; and
   a dryer unit arranged vertically above the scrubber unit and configured to receive and dry the wafer after the mechanical scrub cleaning,
   wherein the scrubber unit includes a first slot opening from which the wafer is received and a second slot opening that is different from the first slot opening and leads to the dryer unit.

2. A wafer preparation system as recited in claim 1, wherein the dryer unit having a first housing side and a second housing side, the first housing side being configured to join with the second housing side in a closed position and separate from the second housing side in a position that is other than the closed position.

3. A wafer preparation system as recited in claim 2, wherein the second housing side is positioned in a fixed orientation relative to the scrubber unit and the first housing side is movable with respect to the second housing side.

4. A wafer preparation system as recited in claim 3, wherein the first housing side is movable in a direction that is perpendicular to a vertical direction.

5. A wafer preparation system as recited in claim 4, wherein the scrubber unit includes a first slot opening from which the wafer is received and a second slot opening that is different from the first slot opening and leads to the dryer unit, and the wafer is configured to be transitioned from within the scrubber unit through the second slot opening and into the dryer unit.

6. A wafer preparation system as recited in claim 1, further comprising:
   a lifter rod having a first end and a second end, and
   an edge holder, the edge holder being attached to the lifter rod at the first end, and the edge holder being configured to support the wafer in a vertical orientation.

7. A wafer preparation system as recited in claim 6, wherein the lifter rod is configured to transition the wafer from the scrubber unit to the dryer unit.

8. A wafer preparation system as recited in claim 6, further comprising:
   a lifter rod controller for moving the lifter rod through the scrubber unit and to the dryer unit.

9. A wafer preparation system as recited in claim 8, wherein the lifter rod controller is one of a servo motor, a pneumatic system, a linear actuator system, and a hydraulic system for raising and lowering the lifter rod.

10. A method for preparing a wafer, comprising:

receiving a wafer in a scrubbing station through a first slot opening;

closing the first slot opening to seal the scrubbing station;

opening a second slot opening;

lifting the wafer from the scrubbing station through the second slot opening to a drying station that is vertically arranged over the scrubbing station.

11. A method for preparing a wafer as recited in claim 10, wherein the receiving of the wafer through the first slot opening is located at other than above the scrubbing station.

12. A method for preparing a wafer as recited in claim 11, wherein the lifting of the wafer is from within and out from above the scrubbing station.

13. A method for preparing a wafer as recited in claim 10, wherein the wafer is received in the drying station from the scrubbing station.

14. A method for preparing a wafer as recited in claim 10, further comprising:

transitioning the wafer out of the drying station.

15. A wafer scrubbing and drying apparatus, comprising:

a scrubber unit having scrub brushes oriented to scrub a wafer that is in a vertical orientation; and a dryer unit positioned over a top region of the scrubber unit, the dryer unit being configured to receive the wafer from a slot in the top region of the scrubber unit in the vertical orientation, and wherein the dryer unit is configured to transition to one of an open position, a load/unload position and a closed position.

16. A wafer scrubbing and drying apparatus as recited in claim 15, further comprising:

a lifter rod having a first end and a second end;

an edge holder attached to the first end of the lifter rod and configured to hold the wafer in a vertical orientation; and a lifter controller configured to raise the lifter rod through the scrubber unit to the dryer unit.

17. A semiconductor wafer preparation apparatus, comprising:

a wafer cleaning station; and a drying station mounted over the wafer cleaning station, wherein the wafer cleaning station is configured to be sealed as a closed system and the drying station is configured to be sealed as a closed system.

18. A semiconductor wafer preparation apparatus as recited in claim 17, further comprising:

a lifter rod having a first end and a second end; and an edge holder being connected to the first end of the lifter rod.

19. A semiconductor wafer preparation apparatus as recited in claim 18, wherein the edge holder is configured to support a wafer in a vertical orientation.

20. A semiconductor wafer preparation apparatus as recited in claim 19, wherein the lifter rod is configured to lift the edge holder supporting the wafer through the wafer cleaning station and to the drying station.

21. A semiconductor wafer preparation apparatus as recited in claim 17, wherein the drying station is configured to perform one or more of a spin, a dry, a rinse, and a chemical application.

* * * * *